(12) United States Patent
Tseng et al.

(10) Patent No.: US 9,970,959 B2
(45) Date of Patent: May 15, 2018

(54) COATED PROBE AND METHOD OF FABRICATING THE SAME

(71) Applicant: Industrial Technology Research Institute, Hsinchu (TW)

(72) Inventors: Shih-Chun Tseng, Hsinchu (TW); Ren-Jye Wu, Hsinchu (TW); Ping-Hsing Yang, Tainan (TW); Li-Duan Tsai, Hsinchu (TW); Jin-Bao Wu, Hsinchu (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 665 days.

(21) Appl. No.: 14/494,597

(22) Filed: Sep. 24, 2014

(65) Prior Publication Data

US 2015/0145546 A1   May 28, 2015

(30) Foreign Application Priority Data

Nov. 22, 2013   (TW) .................................. 102142671

(51) Int. Cl.
    *G01R 3/00* (2006.01)
    *G01R 1/067* (2006.01)
    *C23C 14/06* (2006.01)
    *C23C 14/58* (2006.01)

(52) U.S. Cl.
    CPC ...... *G01R 1/06755* (2013.01); *C23C 14/0605* (2013.01); *C23C 14/5846* (2013.01); *G01R 3/00* (2013.01)

(58) Field of Classification Search
    None
    See application file for complete search history.

(56) References Cited

U.S. PATENT DOCUMENTS

| 5,763,879 A * | 6/1998 | Zimmer | G01R 1/06738 250/307 |
| 5,977,259 A | 11/1999 | Sugimoto et al. | |
| 7,082,683 B2 | 8/2006 | Han et al. | |
| 7,735,357 B2 | 6/2010 | Kitazawa et al. | |
| 7,814,565 B2 | 10/2010 | Kim et al. | |
| 2004/0106218 A1 | 6/2004 | Wang et al. | |
| 2004/0239921 A1* | 12/2004 | Schneegans | G01R 1/06761 356/301 |
| 2006/0111581 A1 | 5/2006 | Raab | |
| 2007/0134866 A1 | 6/2007 | Huang et al. | |
| 2009/0088582 A1 | 4/2009 | Inagaki et al. | |
| 2009/0250333 A1 | 10/2009 | Suehiro et al. | |
| 2010/0112828 A1 | 5/2010 | Eldridge et al. | |
| 2011/0163772 A1 | 7/2011 | Kim et al. | |
| 2013/0049784 A1 | 2/2013 | Hirano et al. | |

FOREIGN PATENT DOCUMENTS

| CN | 1801399 | 7/2006 |
| CN | 1868096 | 10/2010 |
| CN | 101992184 A | 3/2011 |
| JP | 05-279854 | 10/1993 |
| JP | H10-030036 | 2/1998 |
| JP | H1164387 | 3/1999 |
| JP | 2001289874 | 10/2001 |
| JP | 2003151707 | 5/2003 |
| JP | 2006143731 | 6/2006 |
| JP | 2006266765 | 10/2006 |
| JP | 2007077363 | 3/2007 |
| JP | 2009073692 | 4/2009 |
| JP | 2009084081 | 4/2009 |
| JP | 2010002391 | 1/2010 |
| JP | 2010515010 | 5/2010 |
| JP | 2011257385 | 12/2011 |
| TW | 200523976 | 7/2005 |
| TW | 200831396 | 8/2008 |
| TW | 201124732 | 7/2011 |
| WO | 2007083681 | 7/2007 |
| WO | 2011031759 | 3/2011 |
| WO | 2012078944 | 6/2012 |

OTHER PUBLICATIONS

"Office Action of Japan Counterpart Application", dated Oct. 6, 2015, p. 1-p. 8, in which the listed references were cited.
"Office Action of Taiwan Counterpart Application", dated Oct. 21, 2015, p. 1-p. 7, in which the listed reference was cited.
Chinese Office Action dated Dec. 30, 2016 of corresponding Application No. 201410014100.X; 9 pages.
Wei Zhang, et al., "Modular Functionalization of Carbon Nanotubes and Fullerences," J. Am. Chem. Soc. 2009, vol. 131, May 29, 2009, pp. 8446-8454.
Sunmi Park, et al., "Assembly of strands of multiwall carbon nanotubes and gold nanoparticles using alkanedithiols," Carbon, vol. 49, Issue 2, Feb. 2011, pp. 487-pp. 494.
Ikuo Soga, et al., "Carbon Nanotube Bumps for LSI Interconnect," Electronic Components and Technology Conference, 2008. ECTC 2008. 58th, May 27-30, 2008, pp. 1390-pp. 1394.
Huan-Chieh Su, et al., "Improving the adhesion of carbon nanotubes to a substrate using microwave treatment," Carbon, vol. 48, Issue 3, Mar. 2010, pp. 805-pp. 812.
Taisuke Iwai, et al., "Carbon Nanotube Bumps for Thermal and Electric Conduction in Transistor," Fujitsu Sci. Tech. J., vol. 43, Issue 4, Oct. 2007, pp. 508-pp. 515.
"Office Action of Taiwan Counterpart Application", dated Jan. 20, 2015, p. 1-p. 9, in which the listed references were cited.

* cited by examiner

*Primary Examiner* — Sheeba Ahmed
(74) *Attorney, Agent, or Firm* — Muncy, Geissler, Olds & Lowe, P.C.

(57) ABSTRACT

A coated probe is provided. The probe includes a probe body and a cladding layer. The probe body has a terminal. The cladding layer covers the surface of the terminal of the probe body, wherein the cladding layer includes a carbon nano-material layer, and the carbon nano-material layer includes a carbon nano-material.

22 Claims, 8 Drawing Sheets

COATED PROBE AND METHOD OF FABRICATING THE SAME

CROSS-REFERENCE TO RELATED APPLICATION

This application claims the priority benefit of Taiwan application serial no. 102142671, filed on Nov. 22, 2013. The entirety of the above-mentioned patent application is hereby incorporated by reference herein and made a part of this specification.

TECHNICAL FIELD

The disclosure relates to a coated probe and a method of fabricating the same.

BACKGROUND

With the improvement in semiconductor technology, the electronic industry is constantly introducing slim and light products combined with many functions, such as a smart phone including the functions of, for instance, a touch panel and wireless network. The numerous functions are mainly computed by an IC chip, wherein the running time for computing and responding decides the consumer's speed of using the products. The speed of response is a relatively important requirement for the modern society with an accelerated pace of life. Therefore, it is very important to be able to determine whether an IC chip is still a satisfactory product after going through hundreds of semiconductor processes such as design, photomask, wafer production, packaging, and testing.

The devices on a wafer are traditionally cut first and then packaged. The current wafer packaging and testing technology has developed the wafer level chip scale package (WLCSP). In WLCSP, a solder ball is first directly laid on the wafer for packaging, and then the wafer is cut into a plurality of IC die. The main difference between the two is the control of the IC test frequency. Test frequency can be adjusted in the former, but not the latter. In this case, for the higher frequency devices, the test difficulty is relatively higher because the resistance generated by the increase in frequency during IC signal testing is relatively higher, and therefore the accuracy of the test is lower, and the test may not even be performed. Moreover, adhesion readily occurs between the current metal probe and a solder ball during the testing process, thereby lowering conductivity. Furthermore, high test frequency readily causes wear of the tip of the probe, thereby reducing the service life of the probe. Therefore, a probe with a long service life and high test reliability is needed to reduce the cost of the semiconductor packaging and testing industry.

SUMMARY

The disclosure provides a coated probe. The probe has good conductivity and mechanical strength.

The coated probe of the disclosure includes a probe body and a cladding layer. The probe body has a terminal. The cladding layer covers the surface of the terminal of the probe body, wherein the cladding layer includes a carbon nano-material layer.

The method of fabricating a coated probe of the disclosure includes the following steps. A probe body having a terminal is provided, wherein the material of the probe body includes a metal, an alloy, or a combination thereof. A carbon nano-material is modified such that the surface of the carbon nano-material contains a —COOH group. The carbon nano-material containing a —COOH group on the surface thereof is reacted with a thiol, such that the surface of the carbon nano-material contains a mercapto group (—SH). The terminal of the probe body is placed and reacted in a solution of the carbon nano-material containing a —SH group on the surface thereof, so as to form a carbon nano-material layer on the surface of the terminal of the probe body.

Another method of fabricating a coated probe of the disclosure includes the following steps. A probe body having a terminal is provided, wherein the material of the probe body includes a metal, an alloy, or a combination thereof. A carbon nano-material is deposited on the surface of the terminal with vapor deposition to form a carbon nano-material layer on the surface of the terminal of the probe body.

Another coated probe of the disclosure includes a probe body and a cladding layer. The probe body has a terminal. The cladding layer covers the surface of the terminal of the probe body, wherein the cladding layer includes a metal nitride layer and the metal nitride layer includes a metal nitride compound.

Yet another method of fabricating a coated probe of the disclosure includes the following steps. A probe body having a terminal is provided, wherein the material of the probe body includes a metal, an alloy, or a combination thereof. A metal nitride compound is deposited on the surface of the terminal with vapor deposition to form a metal nitride layer on the surface of the terminal of the probe body.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
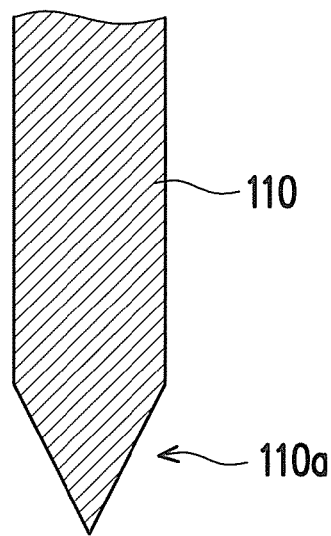
FIG. 1 is a schematic side view of a probe without coating according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
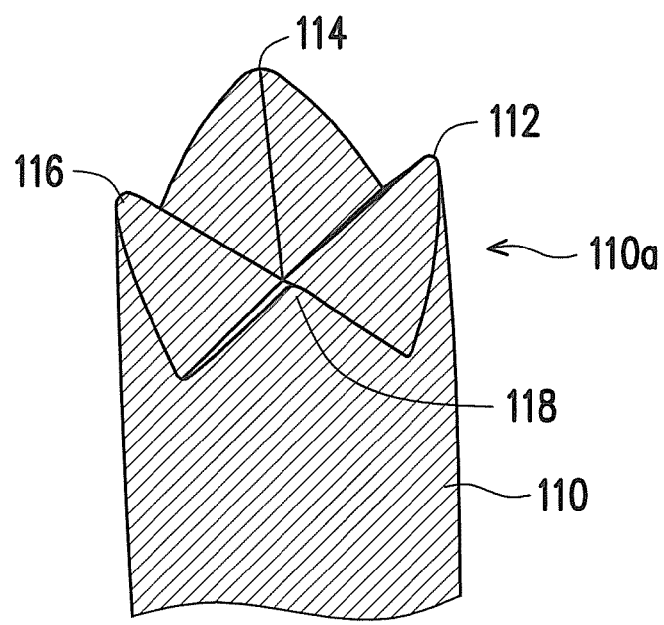
FIG. 2 is a schematic top view of the terminal of a probe without coating according to an embodiment of the disclosure.

FIG. 1 is a schematic side view of a probe without coating according to an embodiment of the disclosure. FIG. 2 is a schematic top view of the terminal of a probe without coating according to an embodiment of the disclosure. Please refer to FIG. 1 and FIG. 2. A probe without coating includes a probe body 110, and the probe body 110 has a terminal 110a as shown in FIG. 2. The terminal 110a of the probe body 110 includes four protrusions 112, 114, 116, and 118, and the terminal 110a is lotus-shaped. However, the disclosure is not limited thereto, provided the terminal 110a of the probe body 110 can make the probe be in contact with a test sample. The material of the probe body 110 is, for instance, a metal, an alloy, or a combination thereof. More specifically, the metal is selected from the group consisting of Cu, Pd, Ag, Au, Re, and W. However, the disclosure does not limit the material of the probe body 110, provided the probe is conductive.

Figure 3:
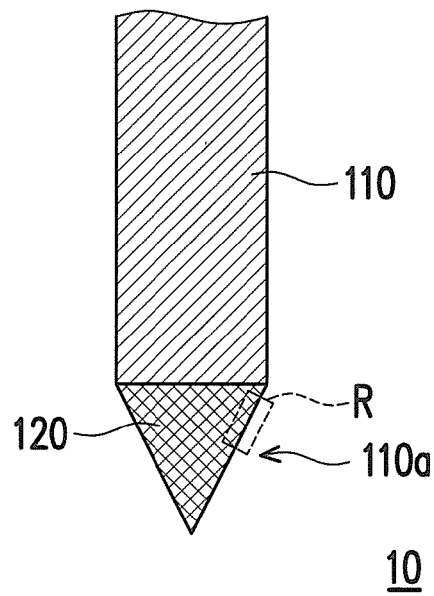
FIG. 3 is a schematic side view of a coated probe according to the first embodiment of the disclosure.
Figure 4:
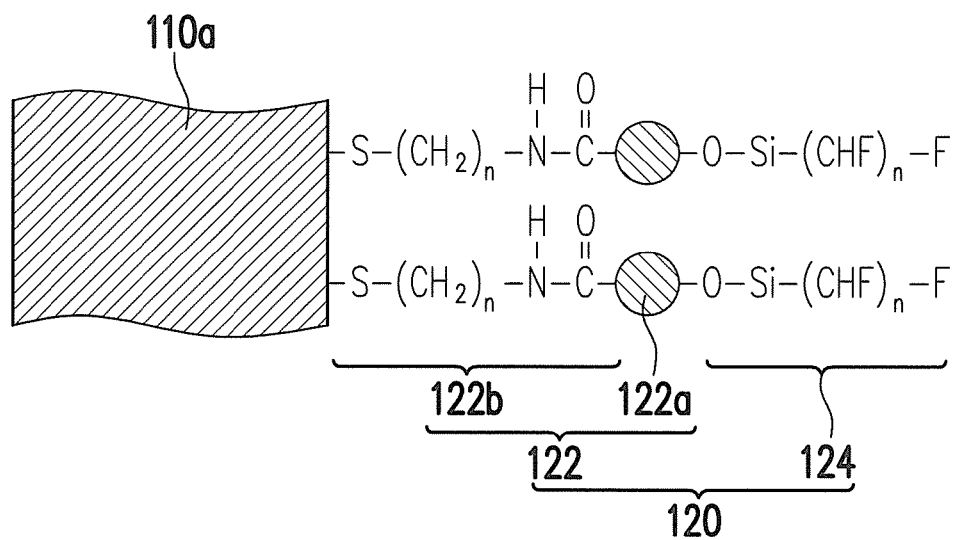
FIG. 4 is a partial enlarged view of the dotted region in FIG. 3.

FIG. 3 is a schematic side view of a coated probe according to the first embodiment of the disclosure. FIG. 4 is a partial enlarged view of the dotted region R in FIG. 3. Please refer to FIG. 3 and FIG. 4. A coated probe 10 of the first embodiment of the disclosure includes a probe body 110 and a cladding layer 120. The probe body 110 has a terminal 110a. The cladding layer 120 covers the surface of the terminal 110a of the probe body 110. In the present embodiment, as shown in FIG. 4, the cladding layer 120 includes a carbon nano-material layer 122 and a hydrophobic layer 124. The thickness of the cladding layer 120 is, for instance, 50 nm to 1 μm, or 50 nm to 0.5 μm. However, the disclosure is not limited thereto. The carbon nano-material layer 122 includes carbon nano-materials 122a and a linking group 122b. The coated probe 10 of the present embodiment is described in detail below with reference to the figures.

In the present embodiment, the carbon nano-material 122a of the carbon nano-material layer 122 comprises, for instance, carbon nano-capsules, carbon nanotubes (CNT), graphene, diamond like carbon (DLC), or a similar material. Since the structures of the carbon nano-capsules are stable and the carbon nano-capsules are readily dispersed in a solvent, from the perspective of increasing the conductivity of the probe and lowering the degree of wear of the probe, the carbon nano-capsules may be a good choice for carbon nano-material 122a. In particular, the particle size of the carbon nano-capsules is, for instance, 100 nm to 10 nm. However, the disclosure is not limited thereto. In the present embodiment, the carbon nano-material layer 122 further includes a linking group 122b. In particular, the linking group 122b includes an amide bond and a mercapto group, and the carbon nano-material 122a is bonded to the terminal 110a of the probe body 110 through the mercapto group of the linking group 122b. It should be mentioned that, in FIG. 4, n in —$(CH_2)_n$— of the linking group 122b is an integer, and $1 \leq n \leq 4$. However, the disclosure is not limited thereto. In other embodiments, the carbon nano-material 122a can also be directly clad on the surface of the terminal 110a without the linking group 122b. Since the surface of the terminal 110a of the coated probe 10 of the present embodiment has the carbon nano-material layer 122, the wear resistance of the terminal 110a of the probe body 110 can be increased, and the conductivity of the probe can also be increased.

Moreover, in the present embodiment, the cladding layer 120 can further include a hydrophobic layer 124. In particular, the carbon nano-material layer 122 is located between the terminal 110a of the probe body 110 and the hydrophobic layer 124. More specifically, the hydrophobic layer 124 includes a fluorosilane group, and the fluorosilane group can be represented by —$Si(CHF)_nF$. In particular, n is an integer, and $1 \leq n \leq 10$. It should be mentioned that, since the surface of the terminal 110a of the coated probe 10 of the present embodiment has the hydrophobic layer 124, adhesion of a solder ball to the terminal 110a of the probe body 110 can be reduced, thereby increasing the accuracy of an IC test.

As described above, the carbon nano-material 122a is bonded to the terminal 110a of the probe body 110 through the mercapto group of the linking group 122b. More specifically, in the case the material of the probe body 110 is a metal, the linking group 122b can form a sulfur-metal bond with the terminal 110a of the probe body 110. Since the bonding force of the bond is strong, the carbon nano-material 122a can be firmly clad on the surface of the terminal 110a of the probe body 110, thereby forming the carbon nano-material layer 122 on the surface of the terminal 110a. Moreover, the carbon nano-material 122a forms an —O—Si bond with a silicon atom of a fluorosilane polymer through an oxygen atom on the surface thereof, such that the fluorosilane polymer can be firmly clad on the surface of the carbon nano-material layer 122 to form the hydrophobic layer 124 and thereby form the bilayer structure of the cladding layer 120 with the carbon nano-material layer 122. However, the disclosure is not limited thereto. In other embodiments, the cladding layer 120 can also be a monolayer structure, that is, the cladding layer 120 only includes the carbon nano-material layer 122. It should be mentioned that, in the present embodiment, since the cladding layer 120 of the surface of the terminal 110a of the coated probe 10 is a bilayer structure including the carbon nano-material layer 122 and the hydrophobic layer 124, the coated probe 10 not only has good wear resistance but also has high conductivity, adhesion of a solder ball to the terminal 110a of the probe body 110 can also be reduced, thereby increasing the accuracy of an IC test.

In the present embodiment, the cladding layer 120 can further include a reactive cross-linking substance (not shown). In particular, the reactive cross-linking substance can form a network structure with the carbon nano-material 122a. Specifically, the reactive cross-linking substance can crosslink the carbon nano-material 122a and the terminal 110a of the probe body 110 together, or crosslink molecules of the carbon nano-material 122a together. Through the cross-linking reaction of the reactive cross-linking substance, the mechanical strength of the carbon nano-material layer 122 and the adhesion strength between the carbon nano-material layer 122 and the terminal 110a of the probe body 110 can be improved, thereby increasing the service life of the coated probe 10.

In the present embodiment, the reactive cross-linking substance can include two or more reactive functional groups. In particular, the reactive functional groups are, for instance, selected from the group consisting of —OH, —SH, —COOH, —SiH, —SiOR, and —NH$_2$. More specifically, the reactive cross-linking substance is, for instance, 1,2-bis(trichlorosilyl) ethane or 1,6-bis(trichlorosilyl) hexane. The method of fabricating the coated probe 10 of the present embodiment is described in detail below with reference to the figures.

Figure 5:
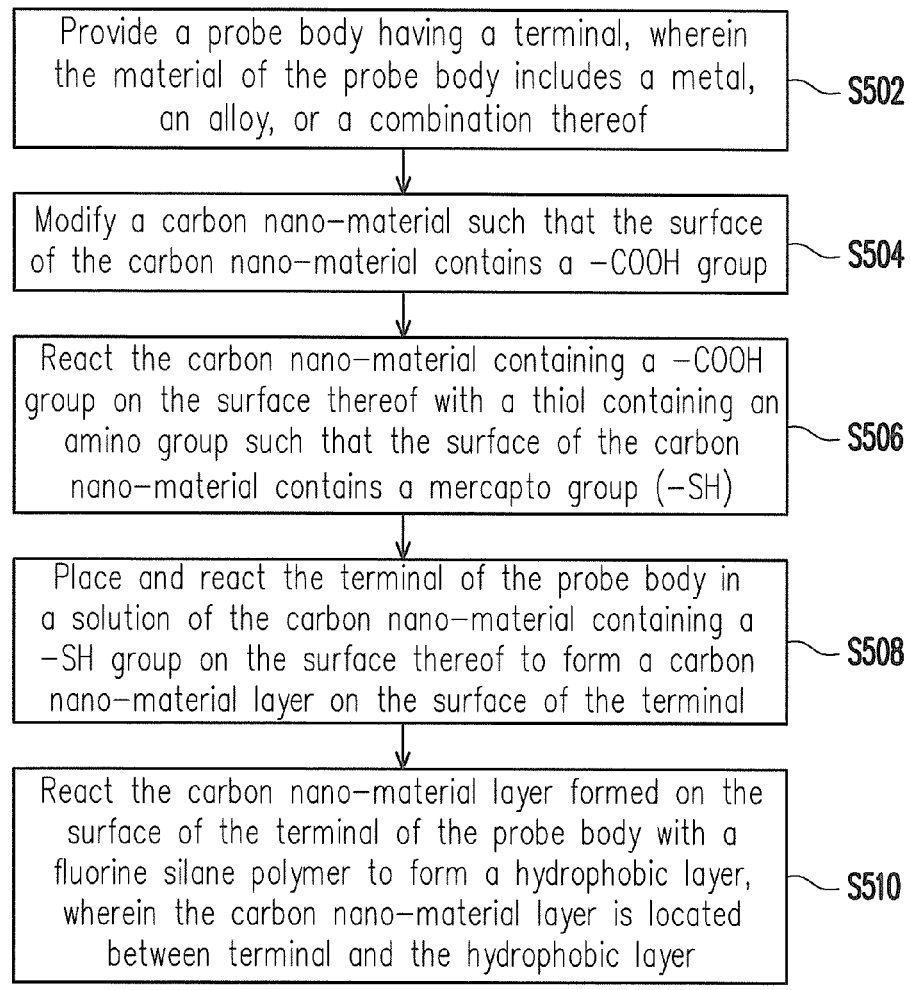
FIG. 5 is a flow chart of a method of fabricating a coated probe according to the first embodiment of the disclosure.

FIG. 5 is a flow chart of a method of fabricating a coated probe according to the first embodiment of the disclosure. It should be mentioned that, in the present embodiment, dip coating is used as an example. However, the disclosure is not limited thereto. Electroplating or a similar method can also be used to fabricate the coated probe. First, in step S502, a probe body 110 having a terminal 110a is provided. The material of the probe body 110 includes, for instance, a metal, an alloy, or a combination thereof. Next, in step S504, a carbon nano-material 122a is modified by acidification such that the surface of the carbon nano-material 122a contains a —COOH group. The carbon nano-material 122a includes, for instance, carbon nano-capsules, carbon nano-tubes, graphene, diamond like carbon, or a similar material. Next, in step S506, the carbon nano-material 122a containing a —COOH group on the surface thereof and a thiol (R—SH) containing an amino group (—NH$_2$) are added in N,N-dimethylformamide (DMF) and the mixture solution is reacted in a dehydration reaction for 24 hours at 60° C. After the reaction, the thiol is bonded to the carbon nano-material 122a through an amide bond such that a mercapto group (—SH) is exposed on the surface of the carbon nano-material 122a, thereby forming a plurality of linking groups 122b on the surface of the carbon nano-material 122a. It should be mentioned that, the linking groups 122b refer to the moiety between the surface of the carbon nano-material 122a and the exposed mercapto group. Then, in step S508, the terminal 110a of the probe body 110 is placed in a solution of the carbon nano-material 122a having the linking groups 122b on the surface thereof, such that chemisorption occurs between the exposed mercapto group (—SH) of the linking groups 122b and the terminal 110a of the probe for about 5 to 10 minutes to form a sulfur-metal bond, thereby forming the carbon nano-material layer 122 on the surface of the terminal 110a of the probe body 110.

Lastly, in the present embodiment, to reduce adhesion of a solder ball to the terminal 110a of the probe body 110, a hydrophobic treatment can further be performed to the surface of the carbon nano-material layer 122 in step S510. More specifically, the carbon nano-material layer 122 formed on the surface of the terminal 110a of the probe body 110 is reacted with a fluorosilane polymer for about 30 minutes such that an oxygen atom on the surface of the carbon nano-material layer 122 forms an —O—Si bond with a silicon atom of the fluorosilane polymer, and the hydrophobic layer 124 is formed on the surface of the carbon nano-material layer 122. In particular, the carbon nano-material layer 122 is located between the terminal 110a of the probe body 110 and the hydrophobic layer 124. Although in the present embodiment, the hydrophobic layer 124 is formed after the carbon nano-material layer 122 is formed, a hydrophobic treatment can also be performed to the surface of the carbon nano-material 122a first to form the hydrophobic layer 124 as needed, and then the carbon nano-material 122a having the hydrophobic layer 124 on the surface thereof is reacted with the terminal 110a of the probe body 110. It should be mentioned that, in the present embodiment, since the cladding layer 120 of the surface of the terminal 110a of the coated probe 10 is a bilayer structure including the carbon nano-material layer 122 and the hydrophobic layer 124, the coated probe 10 not only has good wear resistance but also has high conductivity, adhesion to a solder ball can also be reduced, thereby increasing the accuracy of an IC test.

In addition to steps S502 to S510 of FIG. 5 above, to improve the mechanical strength of the carbon nano-material layer 122 and the adhesion strength between the carbon nano-material layer 122 and the terminal 110a of the probe, a reactive cross-linking substance (not shown) can also be added, such that the carbon nano-material 122a and the terminal 110a of the probe body 110 are cross-linked together, or molecules of the carbon nano-material 122a are cross-linked together. In the present embodiment, the reactive cross-linking substance can include two or more reactive functional groups. In particular, the reactive functional groups are, for instance, selected from the group consisting of —OH, —SH, —COOH, —SiH, —SiOR, and —NH$_2$. More specifically, the reactive cross-linking substance is, for instance, 1,2-bis(trichlorosilyl) ethane or 1,6-bis(trichlorosilyl) hexane.

Figure 6:
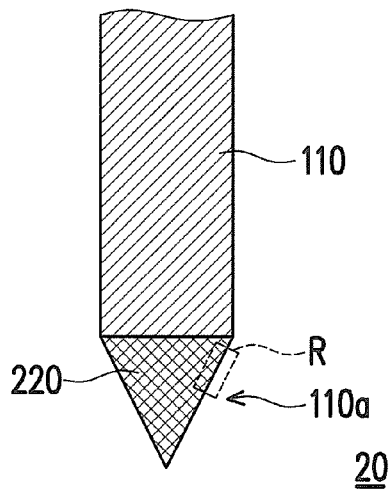
FIG. 6 is a schematic side view of a coated probe according to the second embodiment of the disclosure.
Figure 7:
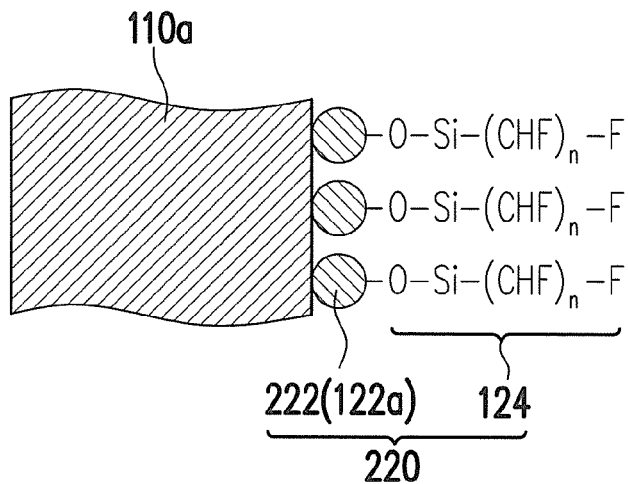
FIG. 7 is a partial enlarged view of the dotted region in FIG. 6.

FIG. 6 is a schematic side view of a coated probe according to the second embodiment of the disclosure. FIG. 7 is a partial enlarged view of the dotted region R in FIG. 6. A coated probe 20 of the present embodiment is similar to the coated probe 10 of the embodiment of FIG. 2, with the main difference being the structure of a carbon nano-material layer 222 in a cladding layer 220. More specifically, in comparison to the carbon nano-material layer 122, the carbon nano-material layer 222 does not include a linking group 122b and is only formed by the carbon nano-material 122a. The present embodiment is described in detail below with reference to the figures. First, referring to FIG. 1 and FIG. 2 again, a probe of the present embodiment without coating similarly includes a probe body 110, and the probe body 110 has a terminal 110a as shown in FIG. 2. The terminal 110a of the probe body 110 includes four protrusions 112, 114, 116, and 118, and the terminal 110a is lotus-shaped. However, the disclosure is not limited thereto, provided the terminal 110a of the probe body 110 can be in contact with a test sample. The material of the probe body 110 is, for instance, a metal, an alloy, or a combination thereof. More specifically, the metal is selected from the group consisting of Cu, Pd, Ag, Au, Re, and W. However, the disclosure does not limit the material of the probe body 110, provided the probe is conductive.

Then, referring to FIG. 6 and FIG. 7, the coated probe 20 of the second embodiment of the disclosure includes a probe body 110 and a cladding layer 220. The probe body 110 has a terminal 110a. The cladding layer 220 covers the surface of the terminal 110a of the probe body 110. In the present embodiment, as shown in FIG. 7, the cladding layer 220 includes a carbon nano-material layer 222 and a hydrophobic layer 124. The thickness of the cladding layer 220 is, for instance, 50 nm to 1 μm, or 50 nm to 0.5 μm. However, the disclosure is not limited thereto. It should be mentioned that, in the present embodiment, the carbon nano-material layer 222 only includes the carbon nano-material 122a and does not have a linking group 122b. The coated probe 20 of the present embodiment is described in detail below with reference to the figures.

In the present embodiment, the carbon nano-material 122a of the carbon nano-material layer 222 includes, for instance, carbon nano-capsules, carbon nanotubes, graphene, diamond like carbon, or a similar material. Similarly, since the structure of the carbon nano-capsules is stable and has strong adhesion with the terminal 110a of the probe body 110, from the perspective of increasing the conductivity of the probe and reducing the degree of wear, the carbon nano-capsules may be a good choice for carbon nano-material 122a. In particular, the particle size of the carbon nano-capsules is, for instance, 100 nm to 10 nm. However, the disclosure is not limited thereto.

It should be mentioned that, the carbon nano-material 122a of the coated probe 10 are bonded to the surface of the terminal 110a of the probe body 110 through the linking group 122b, however the carbon nano-material 122a of the coated probe 20 of the present embodiment can be directly deposited on the surface of the terminal 110a of the probe body 110 with a vapor deposition method. Since the carbon nano-material 122a of the present embodiment is in direct contact with the terminal 110a of the probe body 110, the attractive force between the two is stronger and the carbon nano-material 122a can be more firmly clad on the surface of the terminal 110a of the probe body 110. Moreover, the surface of the coated probe 20 of the present embodiment has the carbon nano-material layer 222, and therefore the wear resistance and the conductivity of the probe can be increased.

Similarly, in the present embodiment, the cladding layer 220 can further include a hydrophobic layer 124. In particular, the carbon nano-material layer 222 is located between the terminal 110a of the probe body 110 and the hydrophobic layer 124. Similarly, the hydrophobic layer 124 of the cladding layer 220 includes a fluorosilane group, and the fluorosilane group can be represented by —Si(CHF)$_n$F. In particular, n is an integer, and 1≤n≤10. It should be mentioned that, since the surface of the coated probe 20 of the present embodiment has the hydrophobic layer 124, adhesion to a solder ball can be reduced, thereby increasing the accuracy of an IC test.

As described above, the carbon nano-material 122a can be directly deposited on the surface of the terminal 110a of the probe body 110 with a vapor deposition method. And since the carbon nano-material 122a is in direct contact with the surface of the terminal 110a of the probe body 110, the carbon nano-material layer 222 can be securely formed on the surface of the terminal 110a of the probe body 110. The disclosure does not limit the vapor deposition method. The vapor deposition method can be, for instance, electron gun evaporation, sputtering, or a similar method. Moreover, the carbon nano-material 122a forms an —O—Si bond with a silicon atom of a fluorosilane polymer through an oxygen atom on the surface thereof, such that the fluorosilane polymer can be firmly clad on the surface of the carbon nano-material layer 222 to form the hydrophobic layer 124 and thereby form the bilayer structure of the cladding layer 220 with the carbon nano-material layer 222. However, the disclosure is not limited thereto. In other embodiments, the cladding layer 220 can also be a monolayer structure, that is, the cladding layer 220 only includes the carbon nano-material layer 222. It should be mentioned that, in the present embodiment, since the cladding layer 220 of the surface of the terminal 110a of the coated probe 20 is a bilayer structure including the carbon nano-material layer 222 and the hydrophobic layer 124, the coated probe 20 not only has good wear resistance but also has high conductivity, adhesion of a solder ball to the terminal 110a of the probe body 110 can also be reduced, thereby increasing the accuracy of an IC test.

Similarly, in the present embodiment, the cladding layer 220 can further include a reactive cross-linking substance (not shown). In particular, a network structure is formed between the reactive cross-linking substance and the carbon nano-material 122a. Specifically, the reactive cross-linking substance can crosslink the carbon nano-material 122a and the terminal 110a of the probe body 110 together, or cross-link molecules of the carbon nano-material 122a together. Through the reactive cross-linking substance, the mechanical strength of the carbon nano-material layer 222 and the adhesion strength between the carbon nano-material layer 222 and the terminal 110a of the probe body 110 can be improved, thereby increasing the service life of the coated probe 20 of the disclosure.

In the present embodiment, the reactive cross-linking substance can include two or more reactive functional groups. In particular, the reactive functional groups are, for instance, selected from the group consisting of —OH, —SH, —COOH, —SiH, —SiOR, and —NH$_2$. More specifically, the reactive cross-linking substance is, for instance, 1,2-bis (trichlorosilyl) ethane or 1,6-bis(trichlorosilyl) hexane. The method of fabricating the coated probe 20 of the present embodiment is described in detail below with reference to the figures.

Figure 8:
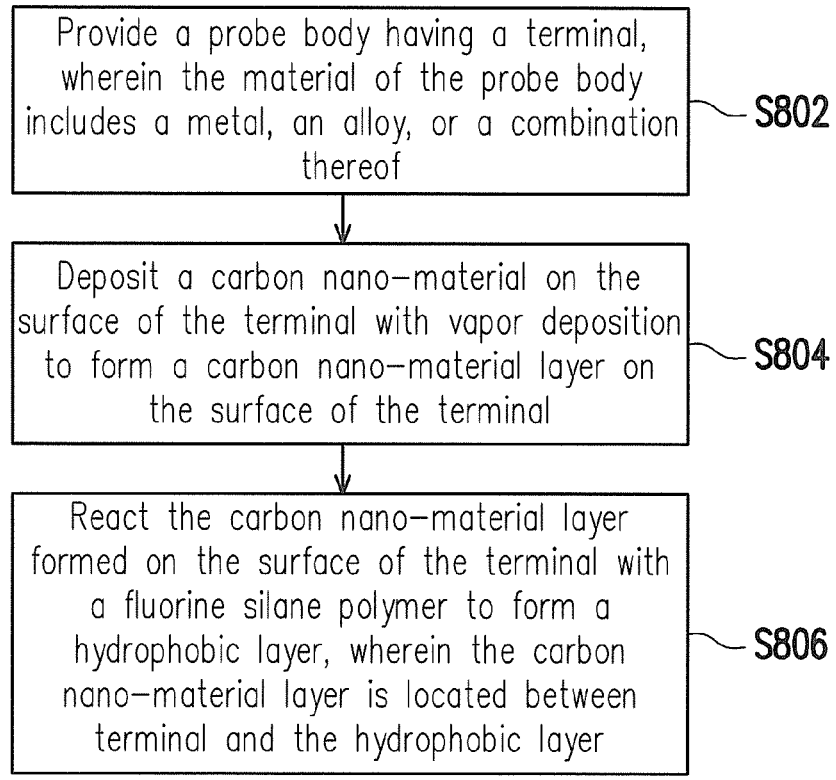
FIG. 8 is a flow chart of a method of fabricating a coated probe according to the second embodiment of the disclosure.

FIG. 8 is a flow chart of a method of fabricating a coated probe according to the second embodiment of the disclosure. It should be mentioned that, in the present embodiment, a vapor deposition method is used as an example, but the disclosure is not limited thereto. First, in step S802, a probe body 110 having a terminal 110a is provided. The material of the probe body 110 includes, for instance, a metal, an alloy, or a combination thereof. Then, in step S804, a carbon nano-material 122a is directly deposited on the surface of the terminal 110a of the probe body 110 with a vapor deposition method to form a carbon nano-material layer 222 on the surface of the terminal 110a of the probe body 110. The vapor deposition method is, for instance, e-gun evaporation, sputtering, or a similar method. However, the disclosure is not limited thereto. Moreover, the disclosure also does not limit the time of vapor deposition. The time of vapor deposition can be adjusted as needed to decide the thickness of the deposited carbon nano-material layer 222.

Lastly, in the present embodiment, to reduce adhesion of a solder ball to the terminal 110a of the probe body 110, a hydrophobic treatment can further be performed to the surface of the carbon nano-material layer 222 in step S806. More specifically, the carbon nano-material layer 222 formed on the surface of the terminal 110a of the probe body 110 is reacted with a fluorosilane polymer for about 30 minutes such that an oxygen atom on the surface of the carbon nano-material layer 222 forms an —O—Si bond with a silicon atom of the fluorosilane polymer, and the hydrophobic layer 124 is formed on the surface of the carbon nano-material layer 222. In particular, the carbon nano-material layer 222 is located between the terminal 110a of the probe body 110 and the hydrophobic layer 124. Although in the present embodiment, the hydrophobic layer 124 is formed after the carbon nano-material layer 222 is formed, a hydrophobic treatment can also be performed to the surface of the carbon nano-material 122a first to form the hydrophobic layer 124 as needed, and then the carbon nano-material 122a having the hydrophobic layer 124 on the surface thereof is reacted with the terminal 110a of the probe body 110. It should be mentioned that, in the present embodiment, since the cladding layer 220 of the surface of the terminal 110a of the coated probe 20 is a bilayer structure including the carbon nano-material layer 222 and the hydrophobic layer 124, the coated probe 20 not only has good wear resistance but also has high conductivity, adhesion to a solder ball can also be reduced, thereby increasing the accuracy of an IC test.

Similarly, in addition to steps S802 to S806 of FIG. 8 above, to improve the mechanical strength of the carbon nano-material layer 222 and the adhesion strength between the carbon nano-material layer 122 and the terminal 110a of the probe body 110, a reactive cross-linking substance (not shown) can also be added, such that the carbon nano-material 122a and the terminal 110a of the probe body 110 are cross-linked together, or molecules of the carbon nano-material 122a are cross-linked together. In the present embodiment, the reactive cross-linking substance can include two or more reactive functional groups. In particular, the reactive functional groups are, for instance, selected from the group consisting of —OH, —SH, —COOH, —SiH, —SiOR, and —NH$_2$. More specifically, the reactive cross-linking substance is, for instance, 1,2-bis(trichlorosilyl) ethane or 1,6-bis(trichlorosilyl) hexane.

Figure 9:
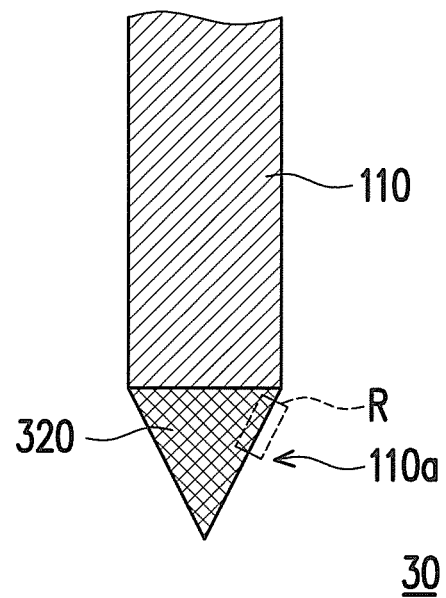
FIG. 9 is a schematic side view of a coated probe according to the third embodiment of the disclosure.
Figure 10:
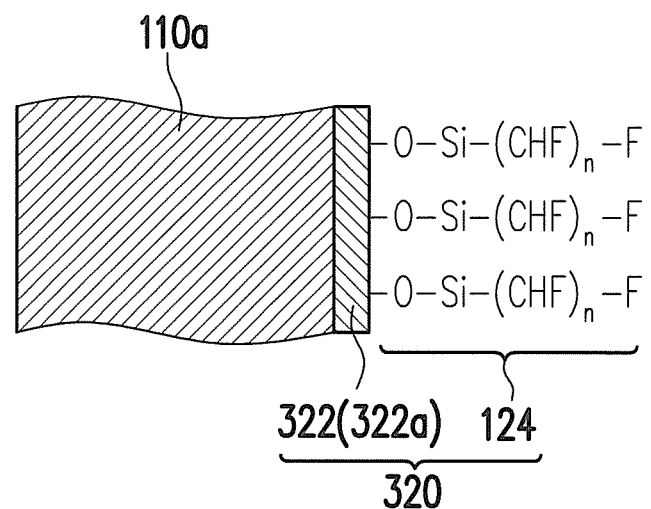
FIG. 10 is a partial enlarged view of the dotted region in FIG. 9.

FIG. 9 is a schematic side view of a coated probe according to the third embodiment of the disclosure. FIG. 10 is a partial enlarged view of the dotted region in FIG. 9. A coated probe 30 of the present embodiment is similar to the coated probe 20 of the embodiment of FIG. 6, with the main difference being the composition of a cladding layer 320. More specifically, in comparison to the cladding layer 220 having a carbon nano-material layer 222, the cladding layer 320 includes a metal nitride layer 322. The present embodiment is described in detail below with reference to the figures. First, referring to FIG. 1 and FIG. 2 again, a probe of the present embodiment without coating similarly includes a probe body 110, and the probe body 110 has a terminal 110a as shown in FIG. 2. The terminal 110a of the probe body 110 includes four protrusions 112, 114, 116, and 118, and the terminal 110a is lotus-shaped. However, the disclosure is not limited thereto, provided the terminal 110a of the probe body 110 can be in contact with a test sample. The material of the probe body 110 is, for instance, a metal, an alloy, or a combination thereof. More specifically, the metal is selected from the group consisting of Cu, Pd, Ag, Au, Re, and W. However, the disclosure does not limit the material of the probe body 110, provided the probe is conductive.

Then, referring to FIG. 9 and FIG. 10, the coated probe 30 of the third embodiment of the disclosure includes a probe body 110 and a cladding layer 320. The probe body 110 has a terminal 110a. The cladding layer 320 covers the surface of the terminal 110a of the probe body 110. In the present embodiment, as shown in FIG. 10, the cladding layer 320 includes a metal nitride layer 322 and a hydrophobic layer 124. The thickness of the cladding layer 320 is, for instance, 50 nm to 1 μm, or 50 nm to 0.5 μm. However, the disclosure is not limited thereto. The coated probe 30 of the present embodiment is described in detail below with reference to the figures.

In the present embodiment, metal nitride compound 322a of the metal nitride layer 322 comprises, for instance, TiN or CrN. However, the disclosure is not limited thereto. It should be mentioned that, the metal nitride compound 322a of the coated probe 30 of the present embodiment can be directly deposited on the surface of the terminal 110a of the probe body 110 with a vapor deposition method. Since the metal nitride compound 322a of the present embodiment is in direct contact with the terminal 110a of the probe body 110, the attractive force between the two is stronger and the metal nitride compound 322a can be firmly clad on the surface of the terminal 110a of the probe body 110. Moreover, the surface of the coated probe 30 of the present embodiment has the metal nitride layer 322, and therefore the wear resistance and the conductivity of the probe can be increased.

Similarly, in the present embodiment, the cladding layer 320 can further include a hydrophobic layer 124. In particular, the metal nitride layer 322 is located between the terminal 110a of the probe body 110 and the hydrophobic layer 124. Similarly, the hydrophobic layer 124 of the cladding layer 320 includes a fluorosilane group, and the fluorosilane group can be represented by —Si(CHF)$_n$F. In particular, n is an integer, and 1≤n≤10. It should be mentioned that, since the surface of the coated probe 30 of the present embodiment has the hydrophobic layer 124, adhesion to a solder ball can be reduced, thereby increasing the accuracy of an IC test.

As described above, the metal nitride compound 322a can be directly deposited on the surface of the terminal 110a of the probe body 110 with a vapor deposition method. Since the metal nitride compound 322a is in direct contact with the terminal 110a of the probe body 110, the metal nitride layer 322 can be securely formed on the surface of the terminal 110a of the probe body 110. The disclosure does not limit the vapor deposition method. The vapor deposition method can be, for instance, e-gun evaporation, sputtering, or a similar method. Moreover, the metal nitride compound 322a forms an —O—Si bond with a silicon atom of a fluorosilane polymer through an oxygen atom of a metal nitrogen oxide on the surface thereof, such that the fluorosilane polymer can be firmly clad on the surface of the metal nitride layer 322 to form the hydrophobic layer 124 and thereby form the bilayer structure of the cladding layer 320 with the metal nitride layer 322. However, the disclosure is not limited thereto. In other embodiments, the cladding layer 320 can also be a monolayer structure, that is, the cladding layer 320 only includes the metal nitride layer 322. It should be mentioned that, in the present embodiment, since the cladding layer 320 of the surface of the terminal 110a of the coated probe 30 is a bilayer structure including the metal nitride layer 322 and the hydrophobic layer 124, the coated probe 30 not only can have good wear resistance and conductivity at the same time, adhesion of a solder ball to the terminal 110a of the probe body 110 can also be reduced, thereby increasing the accuracy of an IC test.

Similarly, in the present embodiment, the cladding layer 320 can further include a reactive cross-linking substance (not shown). In particular, a network structure is formed between the reactive cross-linking substance and the metal nitride compound 322a. Specifically, the reactive cross-linking substance can crosslink the metal nitride compound 322a and the terminal 110a of the probe body 110 together, or crosslink molecules of the metal nitride compound 322a. Through the reactive cross-linking substance, the mechanical strength of the metal nitride layer 322 and the adhesion strength between the metal nitride layer 322 and the terminal 110a of the probe body 110 can be improved, thereby increasing the service life of the coated probe 30 of the disclosure.

In the present embodiment, the reactive cross-linking substance can include two or more reactive functional groups. In particular, the reactive functional groups are, for instance, selected from the group consisting of —OH, —SH, —COOH, —SiH, —SiOR, and —NH$_2$. More specifically, the reactive cross-linking substance is, for instance, 1,2-bis (trichlorosilyl) ethane or 1,6-bis(trichlorosilyl) hexane. The method of fabricating the coated probe 30 of the present embodiment is described in detail below with reference to the figures.

Figure 11:
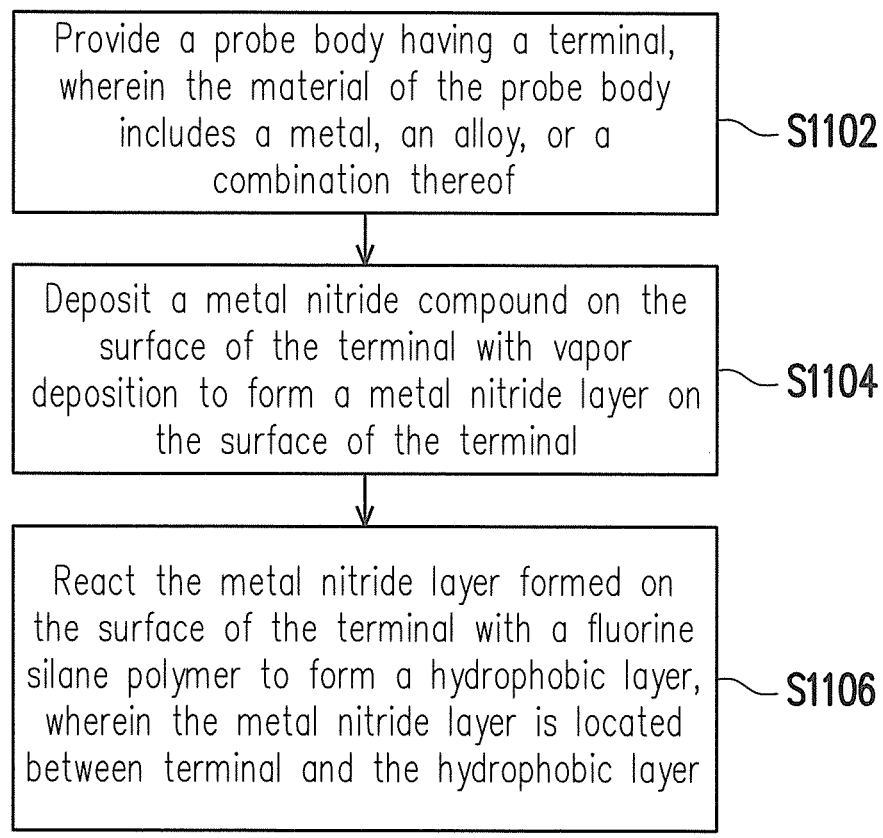
FIG. 11 is a flow chart of a method of fabricating a coated probe according to the third embodiment of the disclosure.

FIG. 11 is a flow chart of a method of fabricating a coated probe according to the third embodiment of the disclosure. It should be mentioned that, in the present embodiment, a vapor deposition method is used as an example, but the disclosure is not limited thereto. First, in step S1102, a probe body 110 having a terminal 110a is provided. The material of the probe body 110 includes, for instance, a metal, an alloy, or a combination thereof. Then, in step S1104, a metal nitride compound 322a is directly deposited on the surface of the terminal 110a of the probe body 110 with a vapor deposition method to form a metal nitride layer 322 on the surface of the terminal 110a of the probe body 110. The vapor deposition method is, for instance, e-gun evaporation, sputtering, or a similar method. However, the disclosure is not limited thereto. Moreover, the disclosure also does not limit the time of vapor deposition. The time of vapor deposition can be adjusted as needed to decide the thickness of the deposited metal nitride layer 322.

Lastly, in the present embodiment, to reduce adhesion of a solder ball to the terminal 110a of the probe body 110, a hydrophobic treatment can further be performed to the surface of the metal nitride layer 322 in step S1106. More specifically, the metal nitride layer 322 formed on the surface of the terminal 110a of the probe body 110 is reacted with a fluorosilane polymer for about 30 minutes such that an oxygen atom on the surface of the metal nitride layer 322 forms an —O—Si bond with a silicon atom of the fluorosilane polymer, and the hydrophobic layer 124 is formed on the surface of the metal nitride layer 322. In particular, the metal nitride layer 322 is located between the terminal 110a of the probe body 110 and the hydrophobic layer 124. Although in the present embodiment, the hydrophobic layer 124 is formed after the metal nitride layer 322 is formed, a hydrophobic treatment can also be performed to the surface of the metal nitride compound 322a first to form the hydrophobic layer 124 as needed, and then the metal nitride compound 322a having the hydrophobic layer 124 on the surface thereof is reacted with the terminal 110a of the probe body 110. It should be mentioned that, in the present embodiment, since the cladding layer 320 of the surface of the terminal 110a of the coated probe 30 is a bilayer structure including the metal nitride layer 322 and the hydrophobic layer 124, the coated probe 30 not only has good wear resistance but also has high conductivity, adhesion to a solder ball can also be reduced, thereby increasing the accuracy of an IC test.

Similarly, in addition to steps S1102 to S1106 of FIG. 11 above, to improve the mechanical strength of the metal nitride layer 322 and the adhesion strength between the metal nitride layer 322 and the terminal 110a of the probe body 110, a reactive cross-linking substance (not shown) can also be added, such that the metal nitride compound 322a and the terminal 110a of the probe body 110 are cross-linked together, or molecules of the metal nitride compound 322a are cross-linked together. In the present embodiment, the reactive cross-linking substance can include two or more reactive functional groups. In particular, the reactive functional groups are, for instance, selected from the group consisting of —OH, —SH, —COOH, —SiH, —SiOR, and —NH$_2$. More specifically, the reactive cross-linking substance is, for instance, 1,2-bis(trichlorosilyl) ethane or 1,6-bis(trichlorosilyl) hexane.

The characteristics and efficacy of the disclosure are further described in the following with experimental embodiments. However, the scope of the disclosure is not limited to the experimental embodiments.

Experimental Embodiment 1

<Fabrication of Multiwall Carbon Nanotube Coated Probe>

The present experimental embodiment is performed according to the method of fabricating a probe of the first embodiment of the disclosure (refer to FIG. 5). First, after multiwall carbon nanotubes (MWCNT) were modified by acidification, a suitable amount of the MWCNT modified by acidification and 2-aminoethanethiol was added to a N,N-dimethylformamide (DMF) solvent, then the mixture solution was placed in an ultrasonic oscillator, and then a dehydration reaction was performed to the mixture solution for 24 hours at 60° C. Next, the terminal of a tungsten probe was placed and reacted in the mixture solution for 5 minutes. The mixture solution was then vacuum dried to form a carbon nano-material layer on the terminal surface of the tungsten probe. Lastly, the carbon nano-material layer was further reacted with a fluorosilane polymer to coat a hydrophobic layer containing a fluorosilane group on the surface of the carbon nano-material layer. Adhesion of a solder ball to the probe is thus reduced.

<Electrical and Life Analysis of Multiwall Carbon Nanotube Coated Probe>

Figure 12:
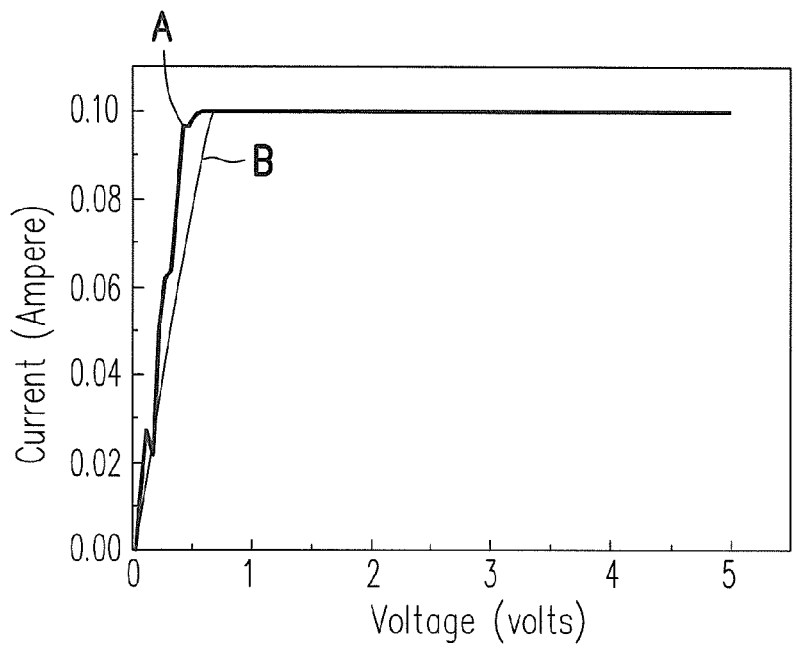
FIG. 12 is a graph of a current-voltage test of a coated probe of an embodiment of the disclosure and a conventional probe.

Electrical analysis of probe: a nano-probe measurement system was used to perform a resistance test on a single probe. The original probe used in the electrical analysis was a tungsten probe. The analysis results are shown in FIG. 12. FIG. 12 is a graph of a current-voltage test of a probe of an embodiment of the disclosure and a conventional probe. The horizontal axis represents voltage (volts) and the vertical axis represents current (Ampere). The results of FIG. 12 show that, under the same voltage ($5 \times 10^{-1}$ volts), the resistance values of the MWCNT coated probe (curve A) of the embodiments of the disclosure and the original probe (curve B) are 5.00Ω and 6.11Ω, respectively. It is therefore known that, coating a carbon nano-material on the surface of the probe does increase the conductivity of the probe.

Life analysis of probe: probe cleaning frequency in the continuous testing was used as an indicator of probe life. The analysis results show that, the probe cleaning frequency of the MWCNT coated probe of the embodiments of the disclosure (once/5 days) is far superior to the probe cleaning frequency of the original probe (once/4 hours on average). It is therefore known that, coating a carbon nano-material on the surface of the probe and forming a hydrophobic layer on the carbon nano-material layer does reduce adhesion to a solder ball and the probe cleaning frequency. As a result, the cost of IC testing is reduced.

Experimental Embodiment 2

<Fabrication of Carbon Nano-Capsule Coated Probe>

The present experimental embodiment is performed according to the method of fabricating a probe of the second embodiment of the disclosure (refer to FIG. 8). First, an e-gun evaporation method was used to deposit a carbon nano-capsule on the terminal surface of a probe. Lastly, the carbon nano-material layer was further reacted with a fluorosilane polymer to coat a hydrophobic layer containing a fluorosilane group on the surface of the carbon nano-material layer. Adhesion of a solder ball to the probe is thus reduced.

<Electrical and Life Analysis of Carbon Nano-Capsule Coated Probe>

Figure 13:
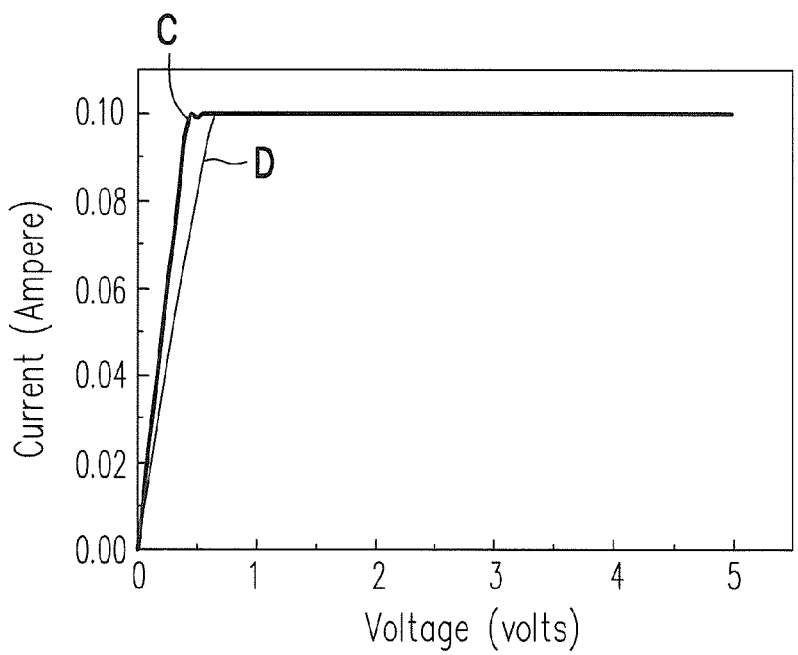
FIG. 13 is a graph of a current-voltage test of a coated probe of another embodiment of the disclosure and a conventional probe.

Electrical analysis of probe: a nano-probe measurement system was used to perform a resistance test on a single probe. The original probe used in the electrical analysis was a tungsten probe. The test results are shown in FIG. 13. FIG. 13 is a graph of a current-voltage test of a probe of another embodiment of the disclosure and a conventional probe. The horizontal axis represents voltage (volts) and the vertical axis represents current (Ampere). The results of FIG. 13 show that, under the same voltage ($5 \times 10^{-3}$ volts), the resistance values of the carbon nano-capsule coated probe (curve C) of the embodiments of the disclosure and the original probe (curve D) are 5.05Ω and 6.11Ω, respectively. It is therefore known that, coating a carbon nano-material on the surface of the probe does increase the conductivity of the probe.

Life analysis of probe: wear rate and probe cleaning frequency were used as indicators of probe life. It is observed that, after continuously testing 15000 times, the wear rate of the carbon nano-capsule coated probe of the embodiments of the disclosure (3%) is far less than that of the original probe (30%). Moreover, the probe cleaning frequency of the carbon nano-capsule coated probe is about once/12 days, and the probe cleaning frequency of the original probe is about once/4 hours. It is therefore known that, coating a carbon nano-material on the surface of the probe and forming a hydrophobic layer on the carbon nano-material layer not only reduces probe cleaning frequency by reducing adhesion to a solder ball, but also reduces wear to the tip of the probe. As a result, the service life of the probe is increased.

Experimental Embodiment 3

<Fabrication of Metal Nitride Coated Probe>

The present experimental embodiment is performed according to the method of fabricating a probe of the third embodiment of the disclosure (refer to FIG. 11). First, a vapor deposition method was used to deposit a metal nitride layer on the terminal surface of a probe. Lastly, the metal nitride layer was further reacted with a fluorosilane polymer to coat a hydrophobic layer containing a fluorosilane group on the surface of the metal nitride layer. Adhesion of a solder ball to the probe is thus reduced.

<Life Analysis of Metal Nitride Coated Probe>

Figure 14:
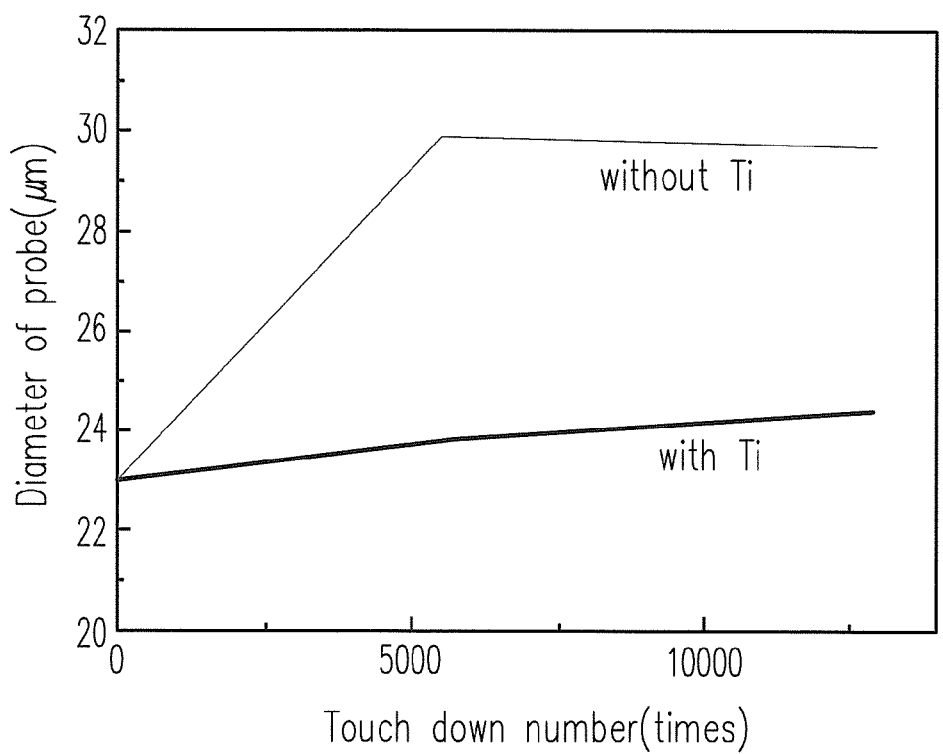
FIG. 14 is a graph of a wear test of a coated probe of further embodiment of the disclosure and a conventional probe.

Life analysis of probe: wear rate was used as an indicator of probe life. The wear rate of a TiN coated probe was evaluated by comparing the diameter of the probe as a function of the touch down number. As shown in FIG. 14, after continuous touch down testing for 10000 times, the diameter of the probe with Ti coating increased from 23 μm to 23.8 μm, while the diameter of the probe without Ti coating increased from 23 μm to 30 μm. The results indicated that the wear rate of the metal nitride layer coated probe of the embodiment (with Ti; 3.4%) is far less than that of the original probe (without Ti; 30%). It is therefore known that, coating a metal nitride layer on the surface of the probe and forming a hydrophobic layer on the metal nitride layer reduces the wear to the tip of the probe and the adhesion to a solder ball. As a result, the service life of the probe is increased.

Based on the above, a cladding layer is formed on the surface of the terminal of a probe to form the coated probe of the embodiments of the disclosure. In particular, the cladding layer is a bilayer structure formed by a carbon nano-material layer or a metal nitride layer and a hydrophobic layer. Therefore, the coated probe of the embodiments of the disclosure not only has good wear resistance but also has high conductivity, adhesion to a solder ball can also be reduced, thereby increasing the accuracy of an IC test.

Although the disclosure has been described with reference to the above embodiments, it will be apparent to one of the ordinary skill in the art that modifications and variations to the described embodiments may be made without departing from the spirit and scope of the disclosure. Accordingly, the scope of the disclosure will be defined by the attached claims not by the above detailed descriptions.

What is claimed is:

1. A coated probe, comprising:
    a probe body having a terminal; and
    a cladding layer covering a surface of the terminal of the probe body, wherein the cladding layer comprises a carbon nano-material layer and a hydrophobic layer, and wherein the carbon nano-material layer comprises a carbon nano-material and the hydrophobic layer comprises a fluorosilane group, and the fluorosilane group is represented by —Si(CHF)$_n$F, wherein n is an integer, and 1≤n≤10, and the carbon nano-material layer is located between the terminal of the probe body and the hydrophobic layer.

2. The coated probe of claim 1, wherein a material of the probe body comprises a metal, an alloy, or a combination thereof.

3. The coated probe of claim 2, wherein the metal is selected from the group consisting of Cu, Pd, Ag, Au, Re, and W.

4. The coated probe of claim 1, wherein a thickness of the cladding layer is 50 nm to 1 μm.

5. The coated probe of claim 1, wherein the carbon nano-material comprises carbon nano-capsules, carbon nanotubes, graphene, or diamond like carbon.

6. The coated probe of claim 5, wherein a particle size of the carbon nano-capsules is 100 nm to 10 nm.

7. The coated probe of claim 1, wherein the carbon nano-material layer comprises:
    a linking group comprising an amide bond and a mercapto group; and
    the carbon nano-material bonded to the terminal of the probe body through the mercapto group of the linking group.

8. The coated probe of claim 7, wherein the carbon nano-material comprises carbon nano-capsules, carbon nanotubes, graphene, or diamond like carbon.

9. The coated probe of claim 8, wherein a particle size of the carbon nano-capsules is 100 nm to 10 nm.

10. The coated probe of claim 1, wherein the cladding layer further comprises a reactive cross-linking substance, the reactive cross-linking substance crosslinks the terminal of the probe body and the carbon nano-material together, or crosslinks molecules of the carbon nano-material together, such that the reactive cross-linking substance and the carbon nano-material form a network structure.

11. The coated probe of claim 10, wherein the reactive cross-linking substance comprises 1,2-bis(trichlorosilyl) ethane or 1,6-bis(trichlorosilyl) hexane.

12. The coated probe of claim 10, wherein the reactive cross-linking substance comprises two or more reactive functional groups.

13. The coated probe of claim 12, wherein the reactive functional groups are selected from the group consisting of —OH, —SH, —COOH, —SiH, —SiOR, and —NH$_2$.

14. A coated probe, comprising:
a probe body having a terminal; and
a cladding layer covering a surface of the terminal of the probe body, wherein the cladding layer comprises a metal nitride layer and a hydrophobic layer, and wherein the metal nitride layer comprises a metal nitride compound and the hydrophobic layer comprises a fluorosilane group, and the fluorosilane group is represented by —Si(CHF)$_n$F, wherein n is an integer, and 1≤n≤10, and the metal nitride layer is located between the terminal of the probe body and the hydrophobic layer.

15. The coated probe of claim 14, wherein a material of the probe body comprises a metal, an alloy, or a combination thereof.

16. The coated probe of claim 15, wherein the metal is selected from the group consisting of Cu, Pd, Ag, Au, Re, and W.

17. The coated probe of claim 14, wherein a thickness of the cladding layer is 50 nm to 1 μm.

18. The coated probe of claim 14, wherein the metal nitride compound comprises TiN or CrN.

19. The coated probe of claim 14, wherein the cladding layer further comprises a reactive cross-linking substance, the reactive cross-linking substance crosslinks the terminal of the probe body and the metal nitride compound together, or crosslinks molecules of the metal nitride compound together, such that the reactive cross-linking substance and the metal nitride compound form a network structure.

20. The coated probe of claim 19, wherein the reactive cross-linking substance comprises 1,2-bis(trichlorosilyl) ethane or 1,6-bis(trichlorosilyl) hexane.

21. The coated probe of claim 19, wherein the reactive cross-linking substance comprises two or more reactive functional groups.

22. The coated probe of claim 21, wherein the reactive functional groups are selected from the group consisting of —OH, —SH, —COOH, —SiH, —SiOR, and —NH$_2$.

* * * * *